US007122941B2

(12) United States Patent
Tessien et al.

(10) Patent No.: US 7,122,941 B2
(45) Date of Patent: Oct. 17, 2006

(54) ACOUSTIC DRIVER ASSEMBLY WITH RECESSED HEAD MASS CONTACT SURFACE

(75) Inventors: Ross Alan Tessien, Nevada City, CA (US); David G. Beck, Tiburon, CA (US)

(73) Assignee: Impulse Devices, Inc., Grass Valley, CA (US)

( * ) Notice: Subject to any disclaimer, the term of this patent is extended or adjusted under 35 U.S.C. 154(b) by 0 days.

(21) Appl. No.: 11/123,652

(22) Filed: May 5, 2005

(65) Prior Publication Data

US 2006/0043837 A1 Mar. 2, 2006

Related U.S. Application Data

(63) Continuation-in-part of application No. 10/931,918, filed on Sep. 1, 2004, now Pat. No. 6,958,569.

(51) Int. Cl.
*H01L 41/08* (2006.01)

(52) U.S. Cl. ...................................... 310/325; 310/334

(58) Field of Classification Search ................ 310/325, 310/334

See application file for complete search history.

(56) References Cited

U.S. PATENT DOCUMENTS 4,074,152 A * 2/1978 Asai et al. .................. 310/334
4,333,796 A 6/1982 Flynn
4,339,247 A 7/1982 Faulkner et al.
4,563,341 A 1/1986 Flynn
4,757,227 A * 7/1988 Danley et al. ......... 310/323.19
4,991,152 A 2/1991 Letiche
5,030,873 A 7/1991 Owen
5,658,534 A 8/1997 Desborough et al.
5,659,173 A 8/1997 Putterman et al.
5,722,444 A 3/1998 Prokopenko et al.
5,858,104 A 1/1999 Clark
5,994,818 A 11/1999 Abramov et al.
5,998,908 A 12/1999 Goodson
6,146,674 A * 11/2000 Manna et al. ............... 426/238
6,361,747 B1 3/2002 Dion et al.
6,617,765 B1 9/2003 Lagler et al.
6,690,621 B1 2/2004 Porzio
6,956,316 B1 * 10/2005 Tessien et al. ......... 310/323.12
6,958,568 B1 * 10/2005 Tessien et al. ......... 310/323.12

(Continued)

FOREIGN PATENT DOCUMENTS

WO WO 01/39205 5/2001

OTHER PUBLICATIONS

M. Dan et al., Ambient Pressure Effect on Single-Bubble Sonoluminescence, Physical Review Letters, Aug. 30, 1999, pp. 1870-1873, vol. 83, No. 9, Published in: US.

(Continued)

*Primary Examiner*—Mark Budd
(74) *Attorney, Agent, or Firm*—Patent Law Office of David G. Beck

(57) ABSTRACT

An acoustic driver assembly for use with any of a variety of cavitation chamber configurations, including spherical and cylindrical chambers as well as chambers that include at least one flat coupling surface, is provided. The acoustic driver assembly includes at least one transducer, a head mass and a tail mass. The end surface of the head mass is shaped so that only a ring of contact is made between the outer perimeter of the head mass of the driver assembly and the cavitation chamber to which the driver is attached. The area of the contact ring is controlled by shaping its surface.

26 Claims, 10 Drawing Sheets

U.S. PATENT DOCUMENTS 6,958,569 B1 * 10/2005 Tessien et al. .............. 310/325
6,960,869 B1 * 11/2005 Tessien et al. .............. 310/325

OTHER PUBLICATIONS

C. Desilets et al., Analyses and Measurements of Acoustically Matched, Air-Coupled Tonpilz Transducers, IEEE Ultrasonics Symposium Proceedings—1999, Oct. 17, 1999, pp. 1045-1048, vol. 2, Publisher: IEEE.

S.C. Butler et al., A Broadband Hybrid Magnetostrictive/Piezoelectric Transducer Array, Magsoft Update, Jul. 2001, pp. 1-7, vol. 7, No. 1, Publisher: Magsoft Corporation, Published in: US.

M.J. Lodeiro et al, High Frequency Displacement and Dielectric Measurements in Piezoelectric Materials, CPM8.1 Characterization of Advanced Functional Materials-Final Project Deliverables, Mar. 2002, pp. 1-12, Volume MATC(MN), No. 21, Publisher: United Kingdom National Physical Laboratory, Published in: United Kingdom.

J.P. Perkins, Power Ultrasonic Equipment, http://www.sonicsystems.co.uk/tech_paper.htm, May 3, 2005, pp. 1-14, based on a paper presented at the Sonochemistry Symposium, Annual Chemical Congress, held at Warwick University, UK, Apr. 8-11, 1996.

S. Sherrit et al., Novel Horn Designs for Ultrasonic/Sonic Cleaning Welding, Soldering, Cutting and Drilling, Proceedings of the SPIE Smart Structures Conf. pp. 1-8, vol. 4701, Paper No. 34, Published in: US.

* cited by examiner

ACOUSTIC DRIVER ASSEMBLY WITH RECESSED HEAD MASS CONTACT SURFACE

REFERENCE TO RELATED APPLICATIONS

This application is a continuation-in-part of U.S. patent application Ser. No. 10/931,918 now U.S. Pat. No. 6,958, 569, filed Sep. 1, 2004.

FIELD OF THE INVENTION

The present invention relates generally to sonoluminescence and, more particularly, to an acoustic driver assembly for use with a sonoluminescence cavitation chamber.

BACKGROUND OF THE INVENTION

Sonoluminescence is a well-known phenomena discovered in the 1930's in which light is generated when a liquid is cavitated. Although a variety of techniques for cavitating the liquid are known (e.g., spark discharge, laser pulse, flowing the liquid through a Venturi tube), one of the most common techniques is through the application of high intensity sound waves.

In essence, the cavitation process consists of three stages; bubble formation, growth and subsequent collapse. The bubble or bubbles cavitated during this process absorb the applied energy, for example sound energy, and then release the energy in the form of light emission during an extremely brief period of time. The intensity of the generated light depends on a variety of factors including the physical properties of the liquid (e.g., density, surface tension, vapor pressure, chemical structure, temperature, hydrostatic pressure, etc.) and the applied energy (e.g., sound wave amplitude, sound wave frequency, etc.).

Although it is generally recognized that during the collapse of a cavitating bubble extremely high temperature plasmas are developed, leading to the observed sonoluminescence effect, many aspects of the phenomena have not yet been characterized. As such, the phenomena is at the heart of a considerable amount of research as scientists attempt to not only completely characterize the phenomena (e.g., effects of pressure on the cavitating medium), but also its many applications (e.g., sonochemistry, chemical detoxification, ultrasonic cleaning, etc.).

Although acoustic drivers are commonly used to drive the cavitation process, there is little information about methods of coupling the acoustic energy to the cavitation chamber. For example, in an article entitled *Ambient Pressure Effect on Single-Bubble Sonoluminescence* by Dan et al. published in vol. 83, no. 9 of Physical Review Letters, the authors describe their study of the effects of ambient pressure on bubble dynamics and single bubble sonoluminescence. Although the authors describe their experimental apparatus in some detail, they only disclose that a piezoelectric transducer was used at the fundamental frequency of the chamber, not how the transducer couples its energy into the chamber.

U.S. Pat. No. 4,333,796 discloses a cavitation chamber that is generally cylindrical although the inventors note that other shapes, such as spherical, can also be used. As disclosed, the chamber is comprised of a refractory metal such as tungsten, titanium, molybdenum, rhenium or some alloy thereof and the cavitation medium is a liquid metal such as lithium or an alloy thereof. Surrounding the cavitation chamber is a housing which is purportedly used as a neutron and tritium shield. Projecting through both the outer housing and the cavitation chamber walls are a number of acoustic horns, each of the acoustic horns being coupled to a transducer which supplies the mechanical energy to the associated horn. The specification only discloses that the horns, through the use of flanges, are secured to the chamber/ housing walls in such a way as to provide a seal and that the transducers are mounted to the outer ends of the horns.

U.S. Pat. No. 5,658,534 discloses a sonochemical apparatus consisting of a stainless steel tube about which ultrasonic transducers are affixed. The patent provides considerable detail as to the method of coupling the transducers to the tube. In particular, the patent discloses a transducer fixed to a cylindrical half-wavelength coupler by a stud, the coupler being clamped within a stainless steel collar welded to the outside of the sonochemical tube. The collars allow circulation of oil through the collar and an external heat exchanger. The abutting faces of the coupler and the transducer assembly are smooth and flat. The energy produced by the transducer passes through the coupler into the oil and then from the oil into the wall of the sonochemical tube.

U.S. Pat. No. 5,659,173 discloses a sonoluminescence system that uses a transparent spherical flask. The spherical flask is not described in detail, although the specification discloses that flasks of Pyrex®, Kontes®, and glass were used with sizes ranging from 10 milliliters to 5 liters. The drivers as well as a microphone piezoelectric were simply epoxied to the exterior surface of the chamber.

U.S. Pat. No. 5,858,104 discloses a shock wave chamber partially filled with a liquid. The remaining portion of the chamber is filled with gas which can be pressurized by a connected pressure source. Acoustic transducers are used to position an object within the chamber while another transducer delivers a compressional acoustic shock wave into the liquid. A flexible membrane separating the liquid from the gas reflects the compressional shock wave as a dilation wave focused on the location of the object about which a bubble is formed. The patent simply discloses that the transducers are mounted in the chamber walls without stating how the transducers are to be mounted.

U.S. Pat. No. 5,994,818 discloses a transducer assembly for use with tubular resonator cavity rather than a cavitation chamber. The assembly includes a piezoelectric transducer coupled to a cylindrical shaped transducer block. The transducer block is coupled via a central threaded bolt to a wave guide which, in turn, is coupled to the tubular resonator cavity. The transducer, transducer block, wave guide and resonator cavity are co-axial along a common central longitudinal axis. The outer surface of the end of the wave guide and the inner surface of the end of the resonator cavity are each threaded, thus allowing the wave guide to be threadably and rigidly coupled to the resonator cavity.

U.S. Pat. No. 6,361,747 discloses an acoustic cavitation reactor in which the reactor chamber is comprised of a flexible tube. The liquid to be treated circulates through the tube. Electroacoustic transducers are radially and uniformly distributed around the tube, each of the electroacoustic transducers having a prismatic bar shape. A film of lubricant is interposed between the transducer heads and the wall of the tube to help couple the acoustic energy into the tube.

PCT Application No. US00/32092 discloses several driver assembly configurations for use with a solid cavitation reactor. The disclosed reactor system is comprised of a solid spherical reactor with multiple integral extensions surrounded by a high pressure enclosure. Individual driver assemblies are coupled to each of the reactor's integral extensions, the coupling means sealed to the reactor's enclosure in order to maintain the high pressure characteristics of the enclosure.

SUMMARY OF THE INVENTION

The present invention provides an acoustic driver assembly for use with any of a variety of cavitation chamber configurations, including spherical and cylindrical chambers as well as chambers that include at least one flat coupling surface. The acoustic driver assembly includes at least one transducer, a head mass and a tail mass. The end surface of the head mass is shaped so that only a ring of contact is made between the outer perimeter of the head mass of the driver assembly and the cavitation chamber to which the driver is attached. The area of the contact ring is controlled by shaping its surface.

Any of a variety of head mass end surface shapes can be used to achieve the desired contact ring. In one embodiment the head mass end surface is concave. In another embodiment the head mass end surface is stepped such that the inner portion of the end surface is recessed relative to the perimeter of the end surface.

In one embodiment the driver assembly is attached to the exterior surface of the cavitation chamber with a threaded means (e.g., all-thread/nut assembly, bolt, etc.). The same threaded means is used to assemble the driver. In an alternate embodiment, a pair of threaded means is used, one to hold together the driver assembly and one to attach the driver assembly to the cavitation chamber. In another alternate embodiment, a threaded means is used to assemble the driver, the threaded means being threaded into the head mass. The driver assembly is attached to the cavitation chamber by forming a permanent or semi-permanent joint between the head mass of the driver assembly and a cavitation chamber wall. The permanent or semi-permanent joint can be comprised of an epoxy bond joint, a braze joint, a diffusion bond joint, or other means. In yet another alternate embodiment, the head mass is comprised of a pair of head mass portions that are coupled together with an all-thread. The driver assembly is held together by coupling the driver components to one of the head mass portions using a threaded means. The second head mass portion is attached to the cavitation chamber wall with either an all-thread or a joint (e.g., bond joint, braze joint, diffusion bond joint, etc.).

In at least one embodiment, the transducer is comprised of a pair of piezo-electric transducers, preferably with the adjacent surfaces of the piezo-electric transducers having the same polarity.

In at least one embodiment, a void filling material is interposed between one or more pairs of adjacent surfaces of the driver assembly and/or the driver assembly and the exterior surface of the cavitation chamber.

A further understanding of the nature and advantages of the present invention may be realized by reference to the remaining portions of the specification and the drawings.

DESCRIPTION OF THE SPECIFIC EMBODIMENTS

Figure 1:
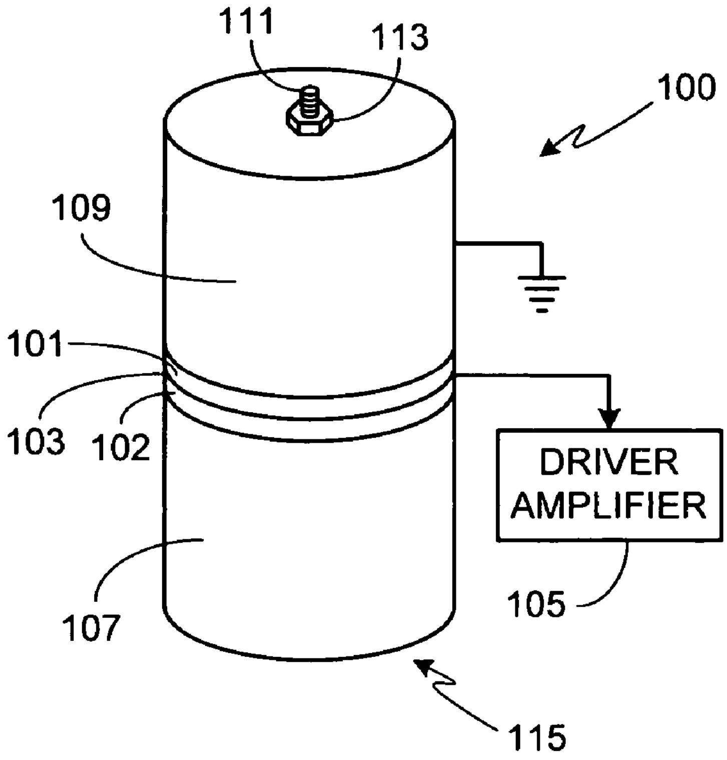
FIG. 1 is a perspective view of a driver assembly.

FIG. 1 is a perspective view of a driver assembly 100. Preferably piezo-electric transducers are used in driver 100 although magnetostrictive transducers can also be used, magnetostrictive transducers typically preferred when lower frequencies are desired. A combination of piezo-electric and magnetostrictive transducers can also be used, for example as a means of providing greater frequency bandwidths.

Although driver assembly 100 can use a single piezo-electric transducer, preferably assembly 100 uses a pair of piezo-electric transducer rings 101 and 102 poled in opposite directions. By using a pair of transducers in which the adjacent surfaces of the two crystals have the same polarity, potential grounding problems are minimized. An electrode disc 103 is located between transducer rings 101 and 102 which, during operation, is coupled to the driver power amplifier 105.

The transducer pair is sandwiched between a head mass 107 and a tail mass 109. In the preferred embodiment both head mass 107 and tail mass 109 are fabricated from stainless steel and are of equal mass. In alternate embodiments head mass 107 and tail mass 109 are fabricated from different materials. In yet other alternate embodiments, head mass 107 and tail mass 309 have different masses and/or different mass diameters and/or different mass lengths. For example tail mass 109 can be much larger than head mass 107.

Preferably driver 100 is assembled about a centrally located all-thread 111 which is screwed directly into the wall of the cavitation chamber (not shown). A cap nut 113 holds the assembly together. In a preferred embodiment, all-thread 111 does not pass through the entire chamber wall, thus leaving the internal surface of the cavitation chamber smooth. This method of attachment has the additional benefit of insuring that there are neither gas nor liquid leaks at the point of driver attachment. In an alternate embodiment, for example with thin walled chambers, the threaded hole to which all-thread 111 is coupled passes through the entire chamber wall. Typically in such an embodiment all-thread 111 is sealed into place with an epoxy or other suitable sealant. Alternately all-thread 111 can be welded or brazed to the chamber wall. It is understood that all-thread 111 and cap nut 113 can be replaced with a bolt or other means of attachment. An insulating sleeve, not viewable in FIG. 1, isolates all-thread 111, preventing it from shorting electrode 103.

For purposes of illustration only, a typical driver assembly is approximately 2.5 inches in diameter with a head mass and a tail mass each weighing approximately 5 pounds. Both the head mass and the tail mass may be fabricated from 17-4 PH stainless steel. Suitable piezo-electric transducers are fabricated by Channel Industries of Santa Barbara, Calif. If the driver assembly is attached to the chamber with an all-thread, the all-thread may be on the order of a 0.5 inch all-thread and the assembly can be tightened to a level of 120 ft-lbs. If an insulating sleeve is used, as preferred, it is typically fabricated from Teflon.

The cavitation chamber to which the driver is attached can be of any regular or irregular shape, although typically the cavitation chamber is spherical, cylindrical, or rectangular in shape. Additionally, it should be appreciated that the invention is not limited to a particular outside chamber diameter, inside chamber diameter or chamber material.

Figure 2:
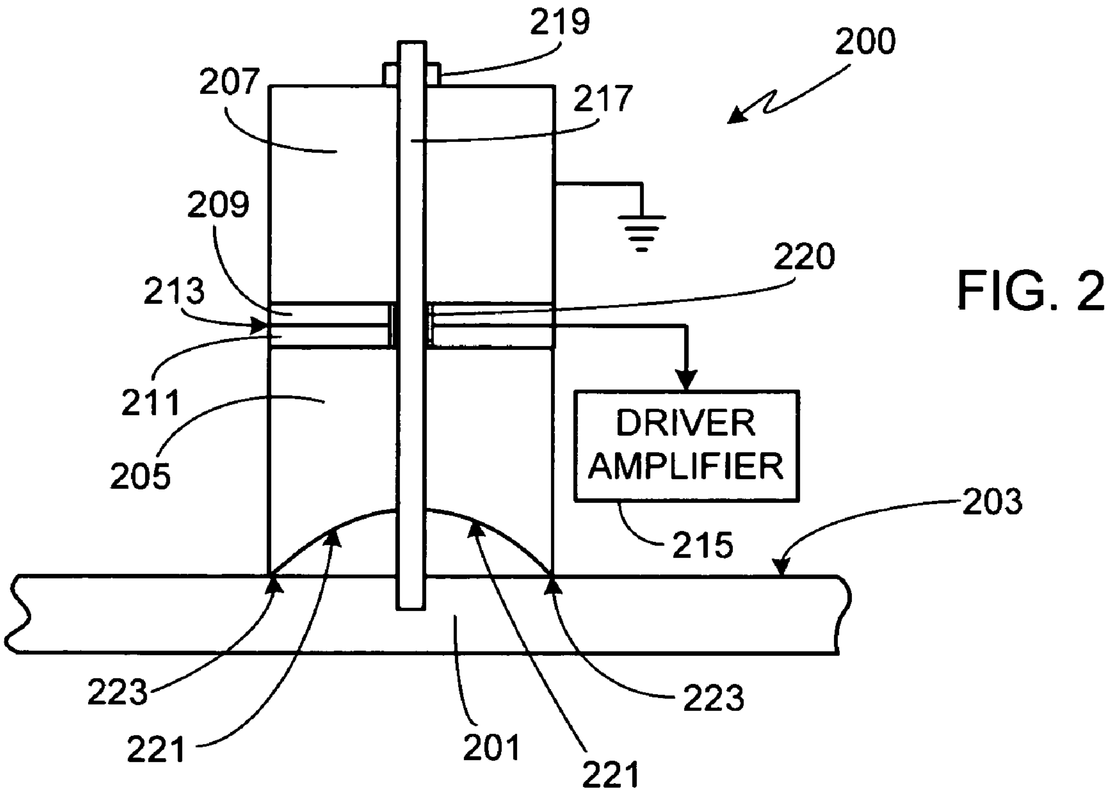
FIG. 2 is a cross-sectional view of an embodiment of the invention in which a driver assembly is attached to a flat cavitation chamber wall.
Figure 3:
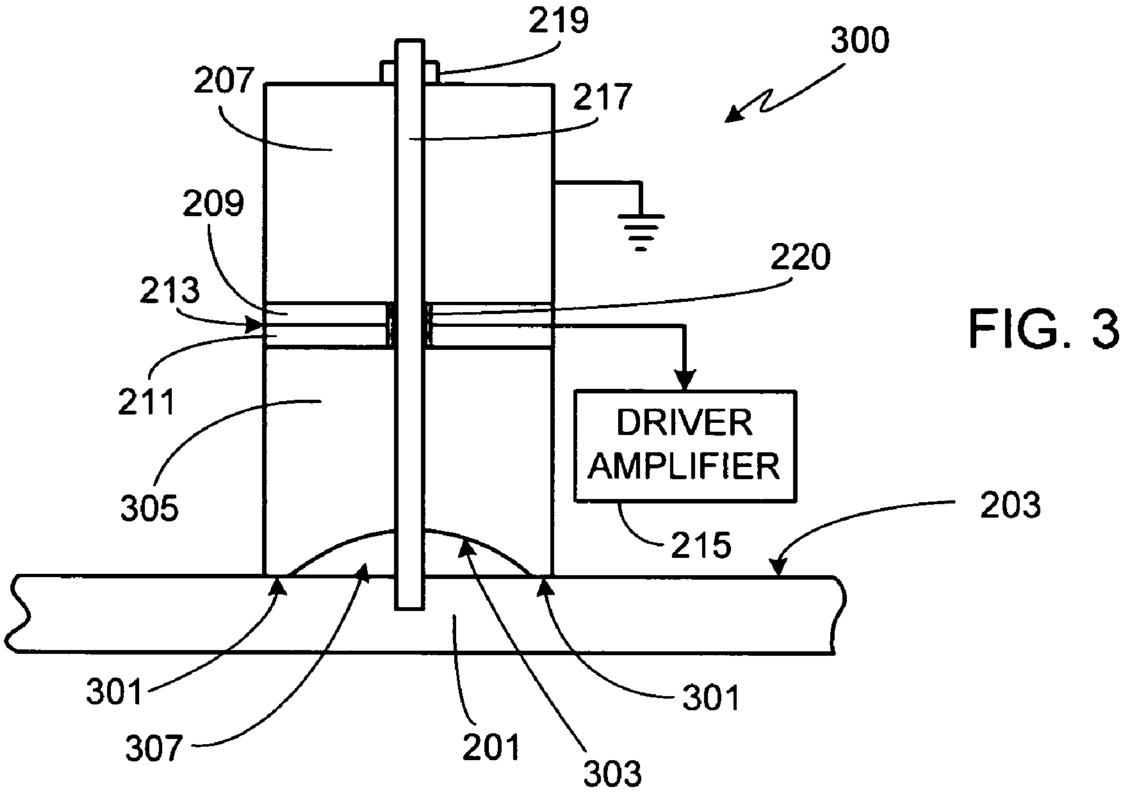
FIG. 3 is a cross-sectional view of a driver assembly similar to that shown in FIG. 2 with an increased ring of contact area between the driver head mass and the flat cavitation chamber wall.

FIGS. 2–19 illustrate embodiments of the invention in which the end surface of the head mass is shaped so that only a ring of contact is made between the driver and the cavitation chamber to which the driver is attached. FIG. 2 is a cross-sectional view of a driver 200 attached to a flat cavitation chamber wall 201. For illustration simplicity, only a portion of the cavitation chamber is shown. It should be understood that driver assembly 200 is attached to the exterior surface 203 of chamber wall 201. It should also be understood that chamber wall 201 may correspond to a square chamber, rectangular chamber, or other chamber shape which includes at least one flat wall. In addition to shaped head mass 205, driver assembly 200 includes a tail mass 207, one or more transducers (e.g., a pair of piezo-electric transducers 209/211 are shown), and means such as an electrode ring 213 for coupling the transducer(s) to a driver amplifier 215. In the illustrated embodiment, an all-thread 217 and a nut 219 are used to mount driver assembly 200 to chamber wall 201. Alternately a bolt or other means can be used to mount driver assembly 200 to wall 201. An insulating sleeve 220 isolates all-thread 217.

Due to the curvature of surface 221 of head mass 205, instead of the entire end surface 221 being in contact with the cavitation chamber, there is only a ring of contact 223 between the two surfaces. To improve the contact between the driver and the chamber, in a preferred embodiment illustrated in FIG. 3 the contact area is increased by shaping (e.g., chamfering) the outer edge 301 of end surface 303 of the head mass 305. As in the previous embodiment, this approach limits the contact area to a ring while maintaining a centrally located cavity 307 between the head mass and the chamber surface.

Figure 4:
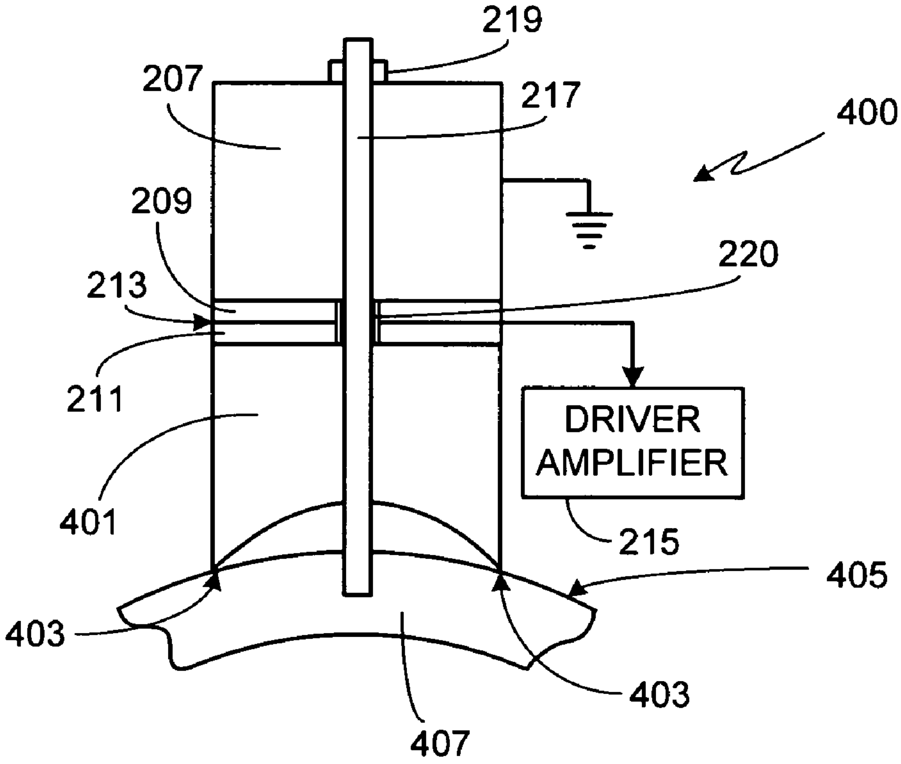
FIG. 4 is a cross-sectional view of an embodiment of the invention in which a driver assembly is attached to a cylindrically shaped cavitation chamber, the view presented in FIG. 4 being along the axis of the cylindrical cavitation chamber.
Figure 5:
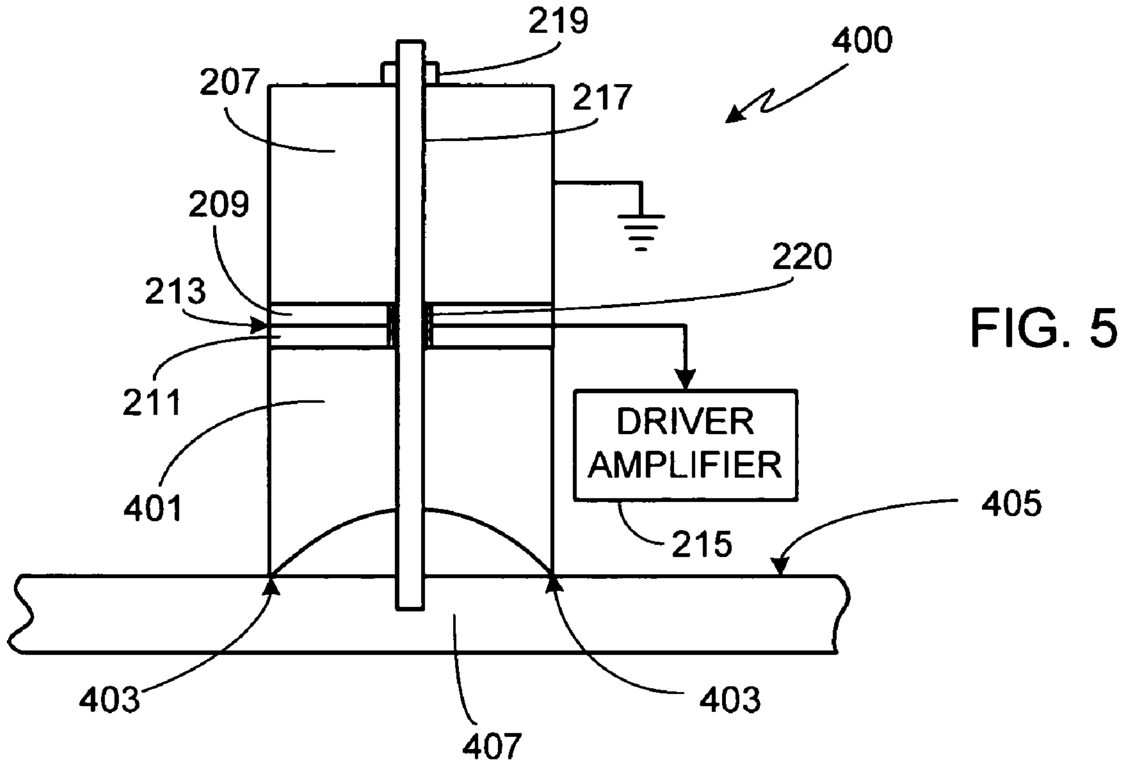
FIG. 5 is an orthogonal cross-sectional view of the embodiment shown in FIG. 4.
Figure 6:
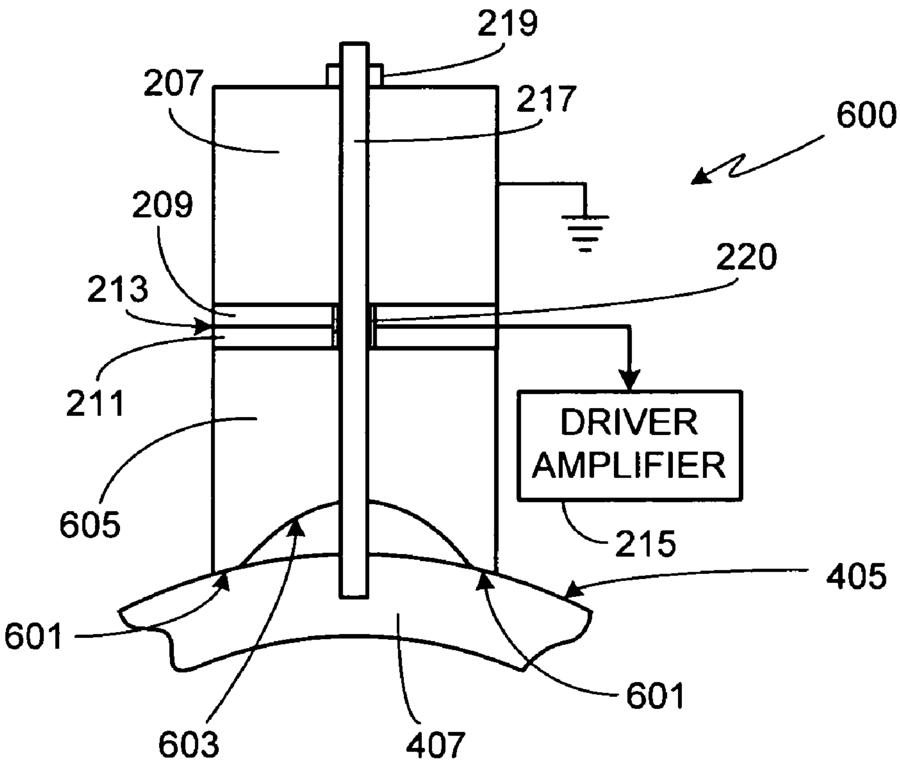
FIG. 6 is a cross-sectional view of a driver assembly similar to that shown in FIG. 4 with an increased ring of contact area between the driver head mass and the cylindrical cavitation chamber wall.
Figure 7:
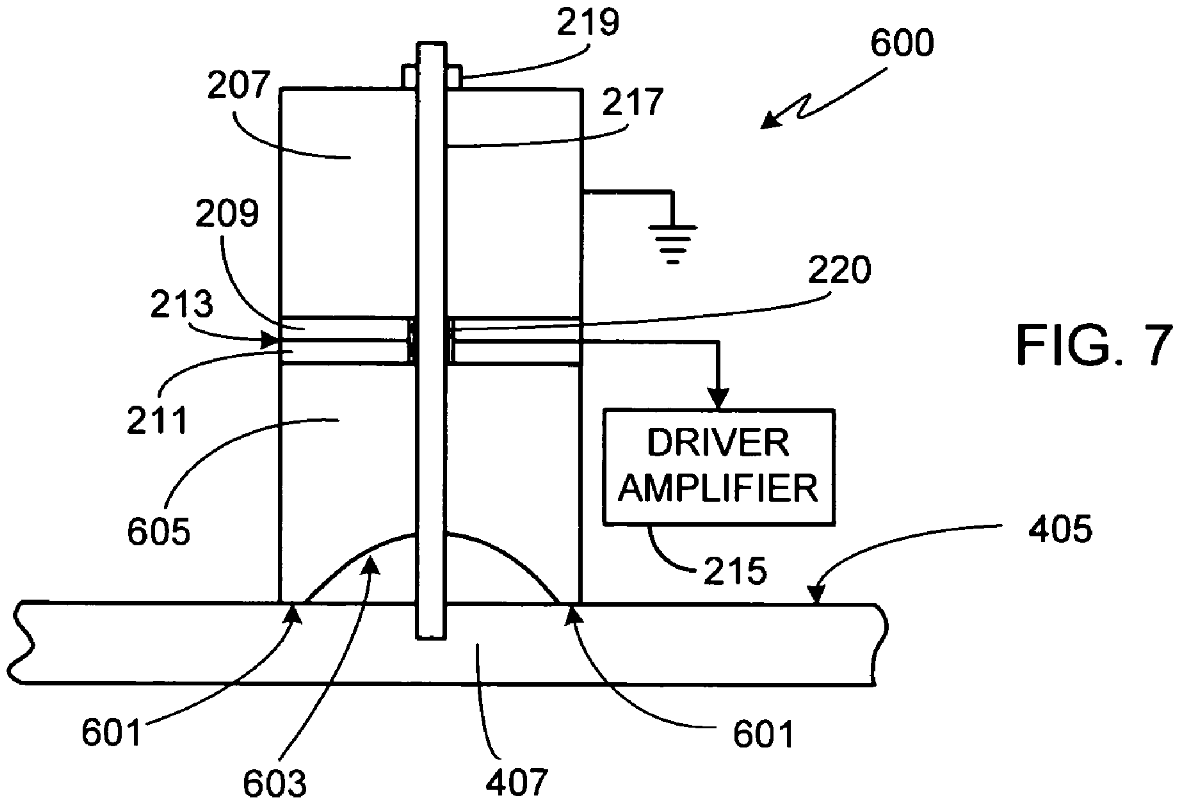
FIG. 7 is an orthogonal cross-sectional view of the embodiment shown in FIG. 6.

FIGS. 4 and 5 are cross-sectional views of a driver assembly similar to that shown in FIG. 2, but in which the cavitation chamber surface is cylindrically shaped. FIG. 4 is a view along the axis of the cylindrical cavitation chamber while FIG. 5 is a view perpendicular to the chamber's axis. As illustrated in these figures, head mass 401 is shaped so that there is a ring of contact 403 between the head mass and the outer surface 405 of cavitation chamber wall 407. If desired, the contact area can be increased by shaping the outer edge 601 of the end surface 603 of the head mass 605 as shown in FIGS. 6 and 7 of driver assembly 600. As with the prior embodiment, FIG. 6 is a view along the axis of the cylindrical cavitation chamber and FIG. 7 is a view perpendicular to the chamber's axis.

Figure 8:
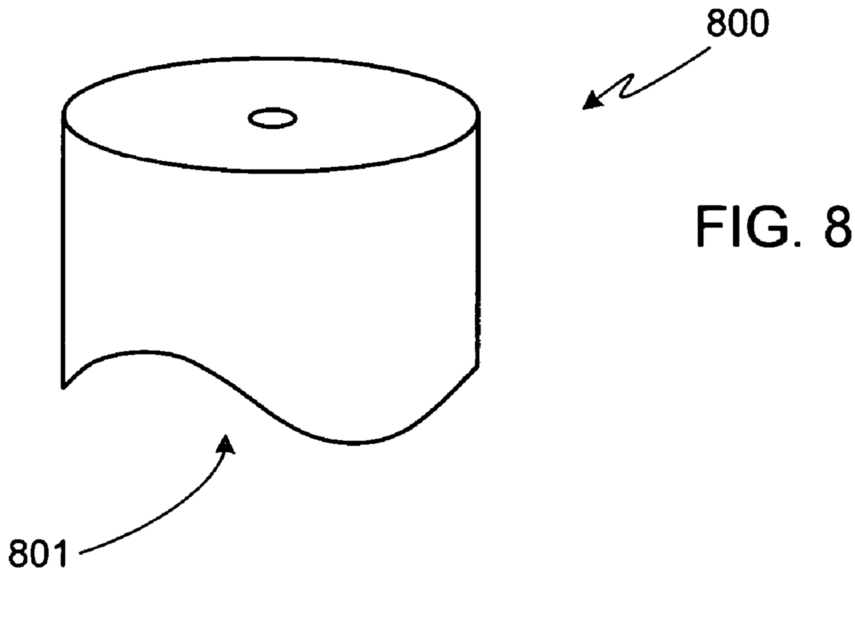
FIG. 8 is a perspective view of a head mass similar to the head mass of the head mass shown in FIGS. 4–7.

FIG. 8 provides a perspective view of a head mass 800 similar to either head mass 401 or head mass 605, thus suitable for use with a cylindrical cavitation chamber. In this view, however, the curvature of the end surface 801 is exaggerated, thereby aiding visualization of the shape of the head mass. It will be appreciated that if the cavitation chamber diameter is sufficiently small relative to the diameter of the driver assembly, end surface 801 is not exaggerated.

In addition to the curved surface (e.g., surface 221) of the head mass shown in the previous embodiments, the inventors also envision that the surface of the head mass that is adjacent to the chamber external surface can utilize other shapes to achieve the desired ring of contact between the chamber wall and the driver assembly. For example, the surface of the head mass can be stepped as shown in FIGS. 9–15.

Figure 9:
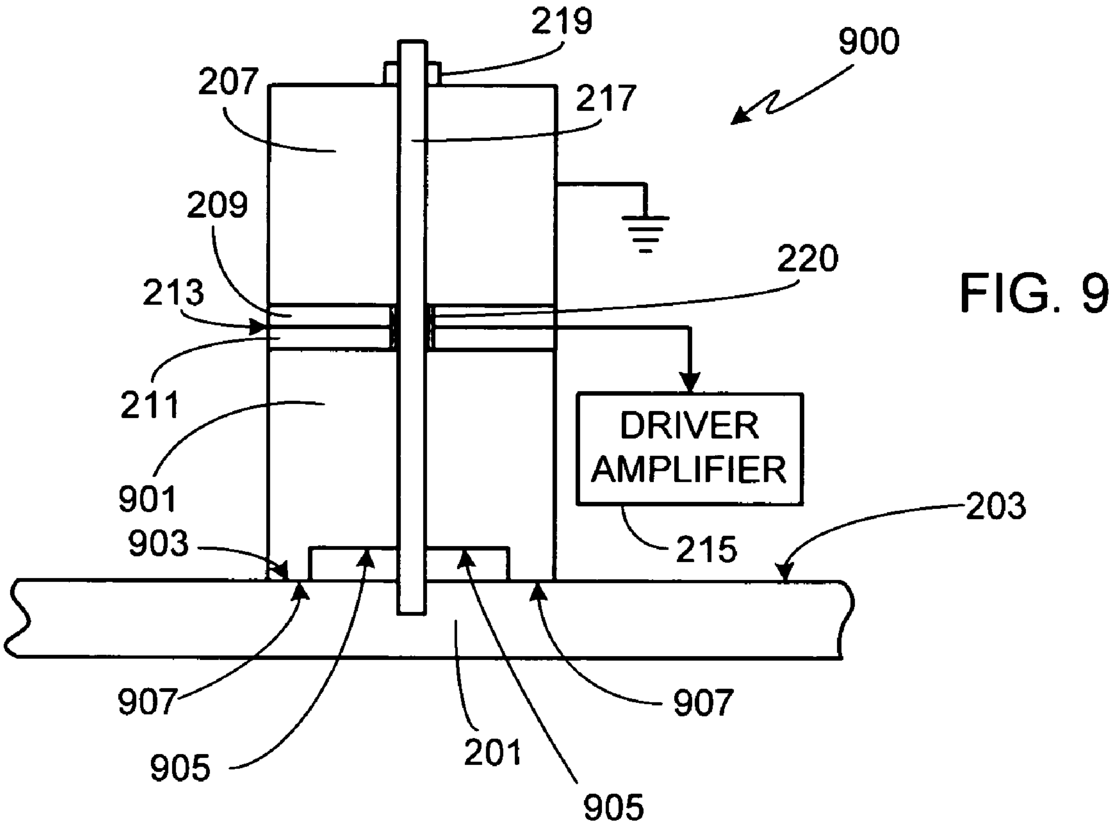
FIG. 9 is a cross-sectional view of a driver assembly in which the area of the contact ring between the driver head mass and the flat cavitation chamber wall is controlled by varying the area of a stepped contact surface.

FIG. 9 is a cross-sectional view of an embodiment of the invention in which driver assembly 900 is attached to flat exterior surface 203 of flat cavitation chamber wall 201. As in the previous illustrations, only a portion of the cavitation chamber is shown. As previously noted, chamber wall 201 may correspond to a square chamber, rectangular chamber or other chamber shape which includes at least one flat wall. The end surface of head mass 901 includes at least two different surfaces 903 and 905, surface 905 recessed relative to surface 903, thereby providing the desired ring of contact 907 between head mass 901 and chamber external surface 203.

Figure 10:
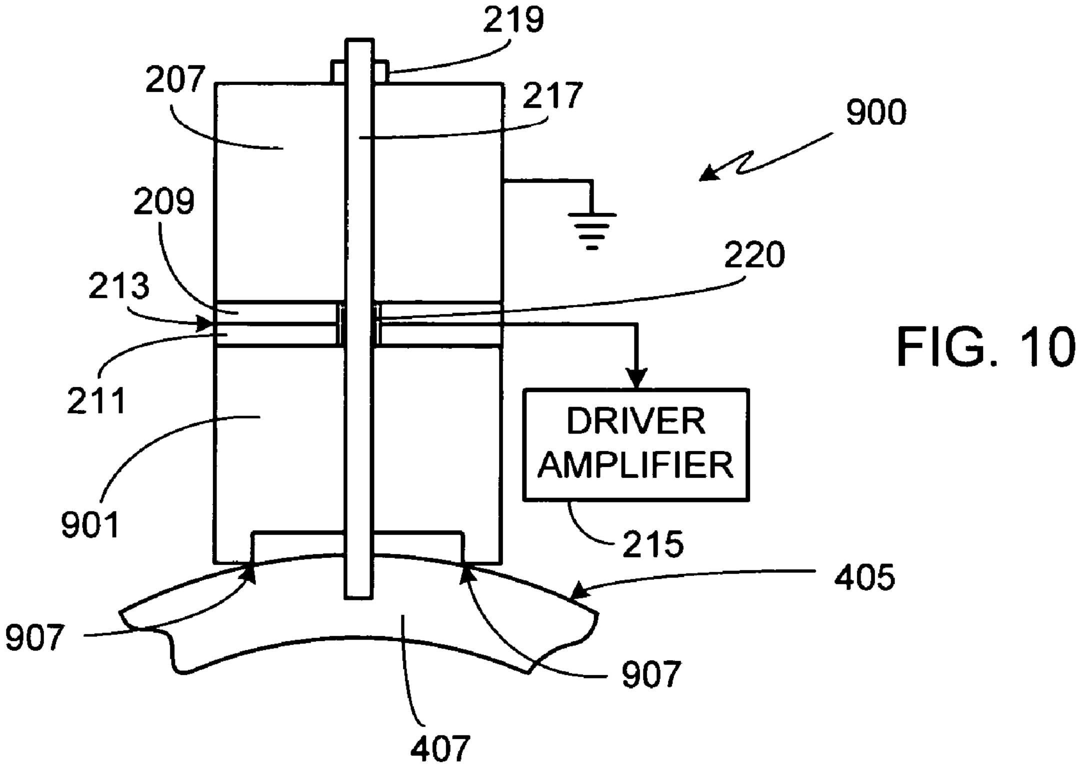
FIG. 10 is a cross-sectional view of an embodiment of the invention in which a driver assembly similar to that of FIG. 9 is attached to a cylindrically shaped cavitation chamber, the view presented in FIG. 10 being along the axis of the cylindrical cavitation chamber.
Figure 11:
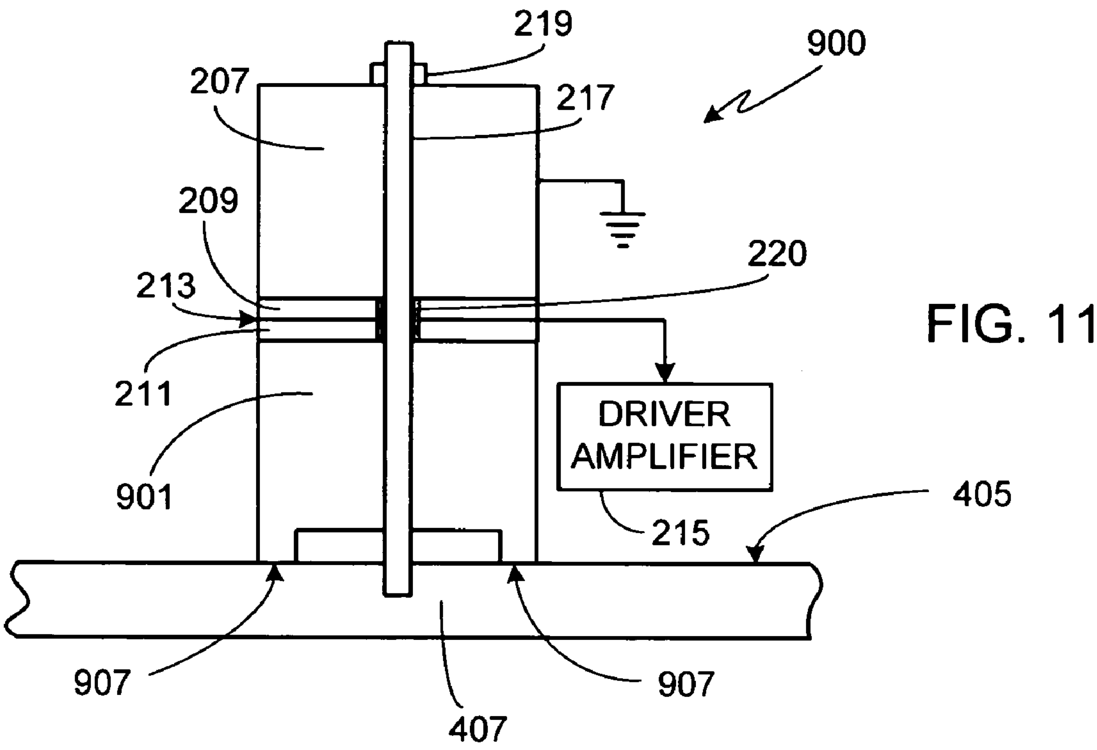
FIG. 11 is an orthogonal cross-sectional view of the embodiment shown in FIG. 10.
Figure 12:
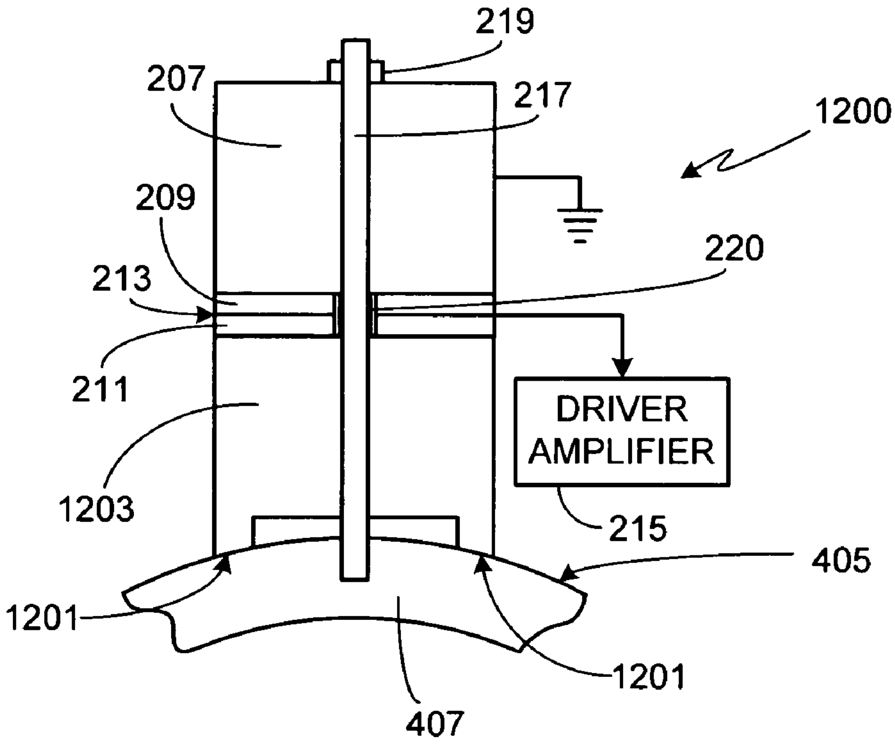
FIG. 12 is a cross-sectional view of an embodiment of the invention in which a driver assembly similar to that of FIG. 9, except for the use of a shaped contact surface, is attached to a cylindrically shaped cavitation chamber, the view presented in FIG. 12 being along the axis of the cylindrical cavitation chamber.
Figure 13:
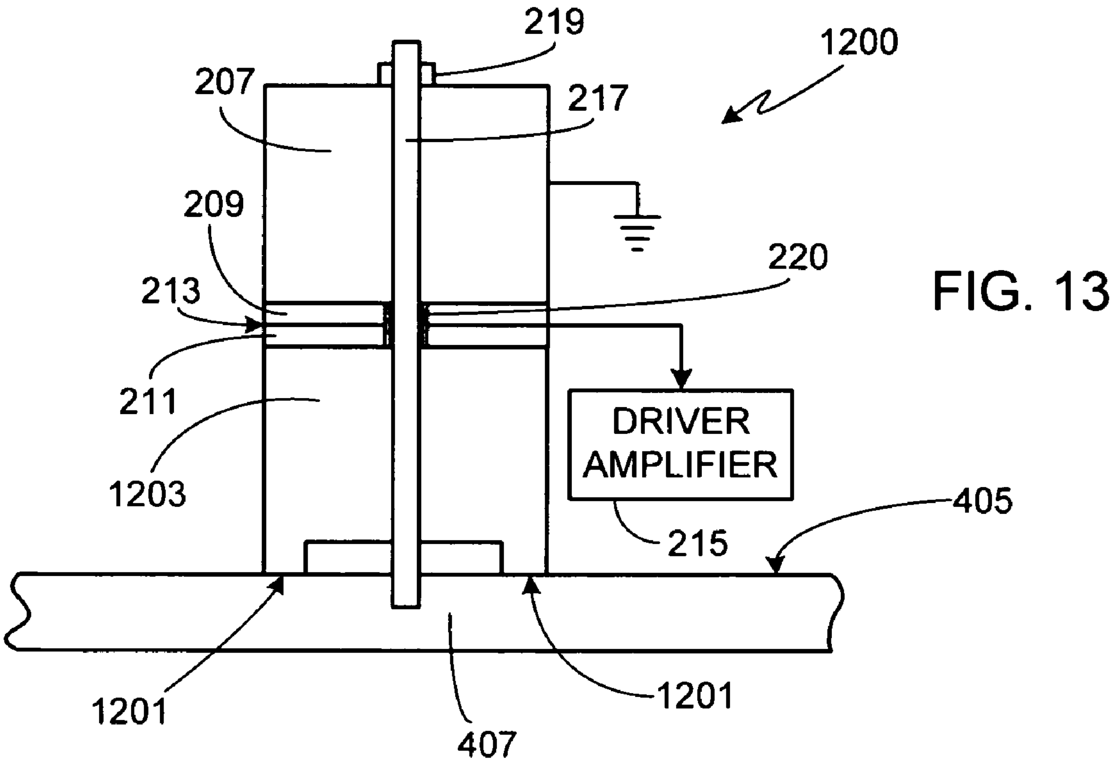
FIG. 13 is an orthogonal cross-sectional view of the embodiment shown in FIG. 12.

FIGS. 10 and 11 illustrate an embodiment of the invention similar to that shown in FIG. 9 as used with a cylindrically shaped cavitation chamber. FIG. 10 is a view along the axis of the cylindrical cavitation chamber while FIG. 11 is a view perpendicular to the chamber's axis. As shown, head mass 901 of driver assembly 900 contacts external chamber surface 405 along ring of contact 907. If desired, the area of the ring of contact can be increased by shaping the contacting surface of the head mass. For example, FIGS. 12 and 13 illustrate a driver assembly 1200 similar to that shown in FIGS. 10 and 11 except contacting surface 1201 of head mass 1203 is shaped to increase the contact area. In the illustrated embodiment, surface 1201 is shaped to match the curvature of the cylindrical external surface 403 of cylindrical chamber wall 401. It is understood that surface 1201 can utilize other curvatures in order to achieve the desired contact area.

Figure 14:
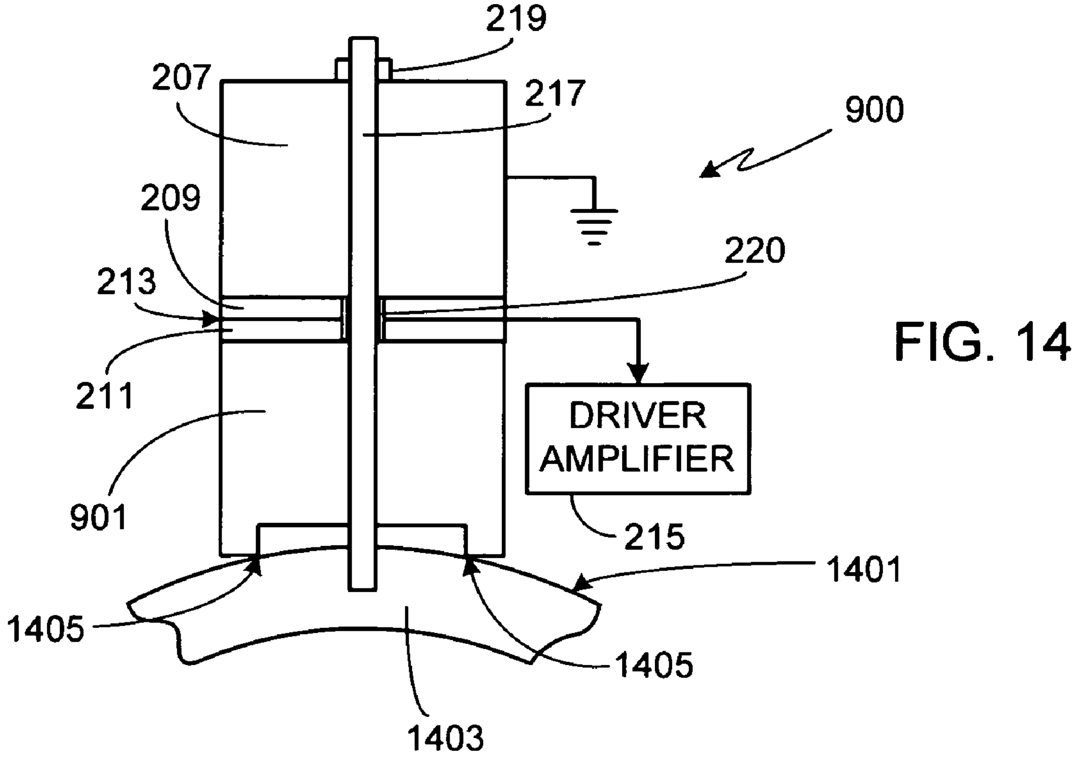
FIG. 14 is a cross-sectional view of an embodiment of the invention in which a driver assembly similar to that of FIG. 9 is attached to a spherically shaped cavitation chamber.
Figure 15:
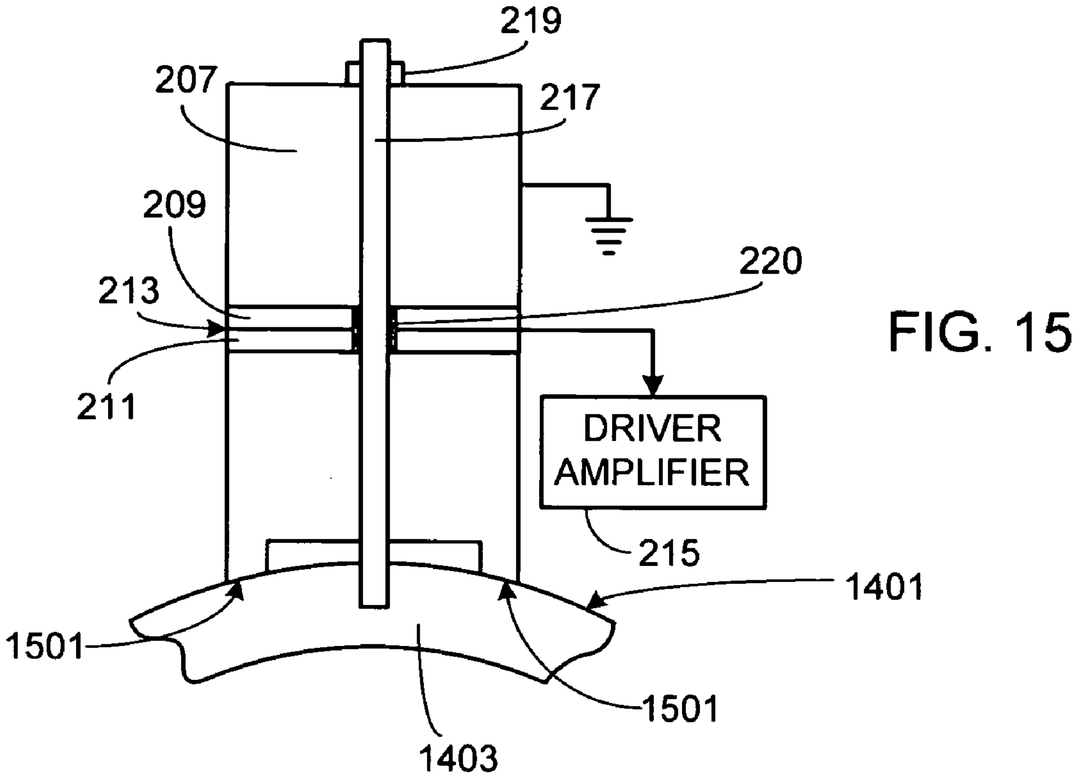
FIG. 15 is a cross-sectional view of an embodiment of the invention in which a driver assembly similar to that of FIG. 9, except for the use of a shaped contact surface, is attached to a spherically shaped cavitation chamber.

FIG. 14 illustrates the use of driver assembly 900 with a spherically shaped chamber. Due to the symmetry of a spherical chamber, only a single view is required to illustrate the embodiment. As shown, head mass 901 of driver assembly 900 contacts external chamber surface 1401 of chamber wall 1403 along a contact ring of 1405. If desired, the area of the ring of contact can be increased by shaping the contacting surface 1501 of the head mass as illustrated in FIG. 15. Although the curvature of the contacting surface in FIG. 15 matches the curvature of the spherical surface of the chamber, it will be appreciated that other curvatures can be used, thus providing a relatively simple means of controlling the area of the ring of contact between the driver assembly and the spherical chamber.

Figure 16:
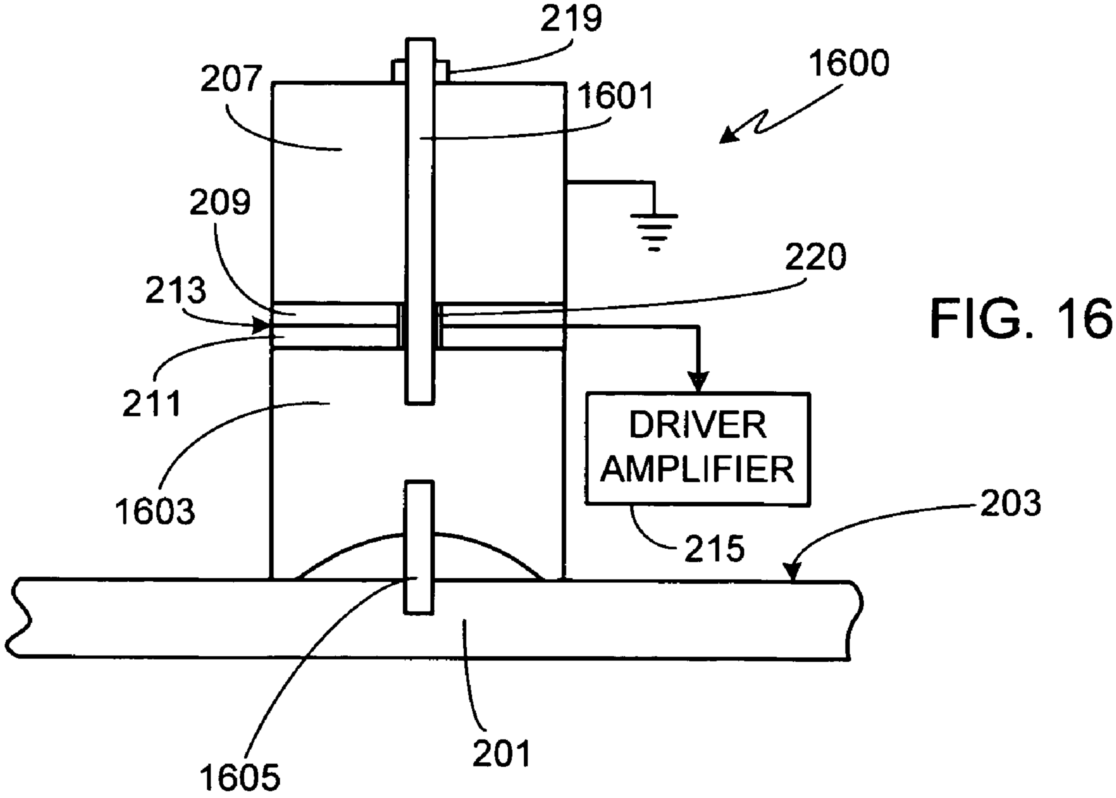
FIG. 16 is a cross-sectional view of an assembly illustrating an alternate means of attaching any of the driver assemblies of FIGS. 2–15 to a cavitation chamber wall.
Figure 17:
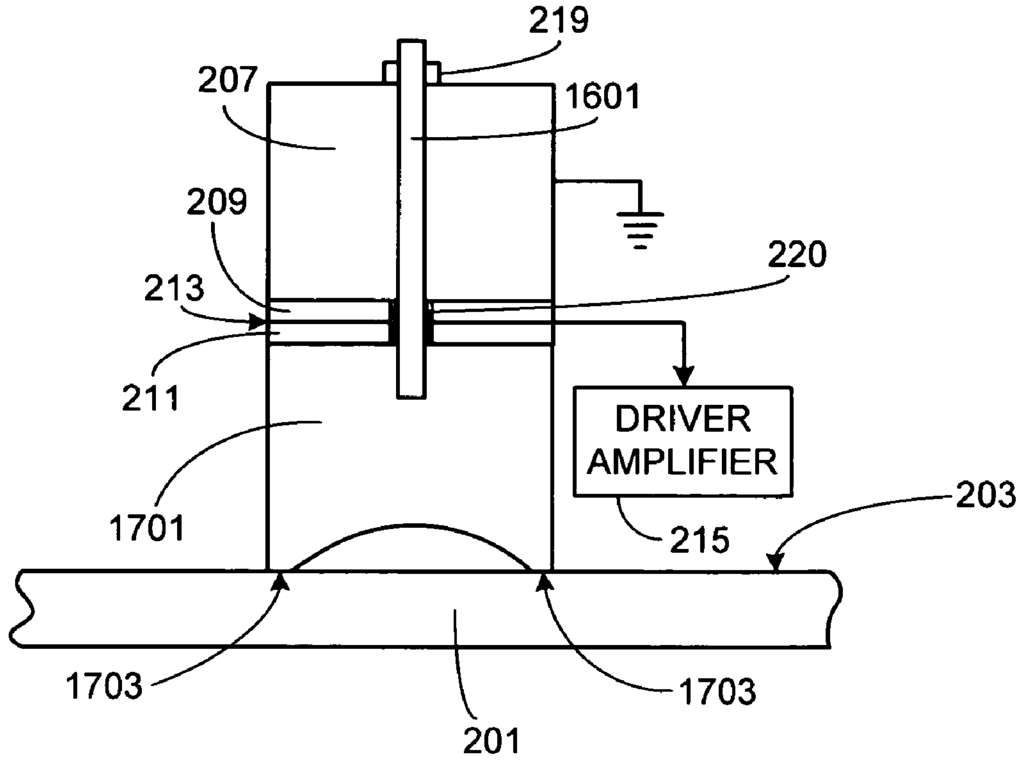
FIG. 17 is a cross-sectional view of an assembly illustrating an alternate means of attaching any of the driver assemblies of FIGS. 2–15 to a cavitation chamber wall.

Although the embodiments described above are shown with either an all-thread/nut or bolt means of attachment, any of these embodiments can also utilize other mounting means. For example, FIG. 16 is an illustration of a driver assembly 1600 similar to that shown in FIG. 3, but in which the driver is assembled about a first threaded means 1601 (e.g., all-thread or bolt) which is threaded into head mass 1603. Coupling means, for example an all-thread member 1605 as shown, is used to couple head mass 1603 to surface 203 of chamber wall 201. Alternately and as illustrated in FIG. 17, the head mass (i.e., head mass 1701) can be semi-permanently or permanently attached to the cavitation chamber at a joint 1703. Joint 1703 can be comprised of an epoxy (or other adhesive) bond joint, a braze joint, a diffusion bond joint, or other means. As with the embodiment illustrated in FIG. 16, the remaining portions of the driver assembly are coupled to the head mass with an all-thread/nut or bolt means.

Figure 18:
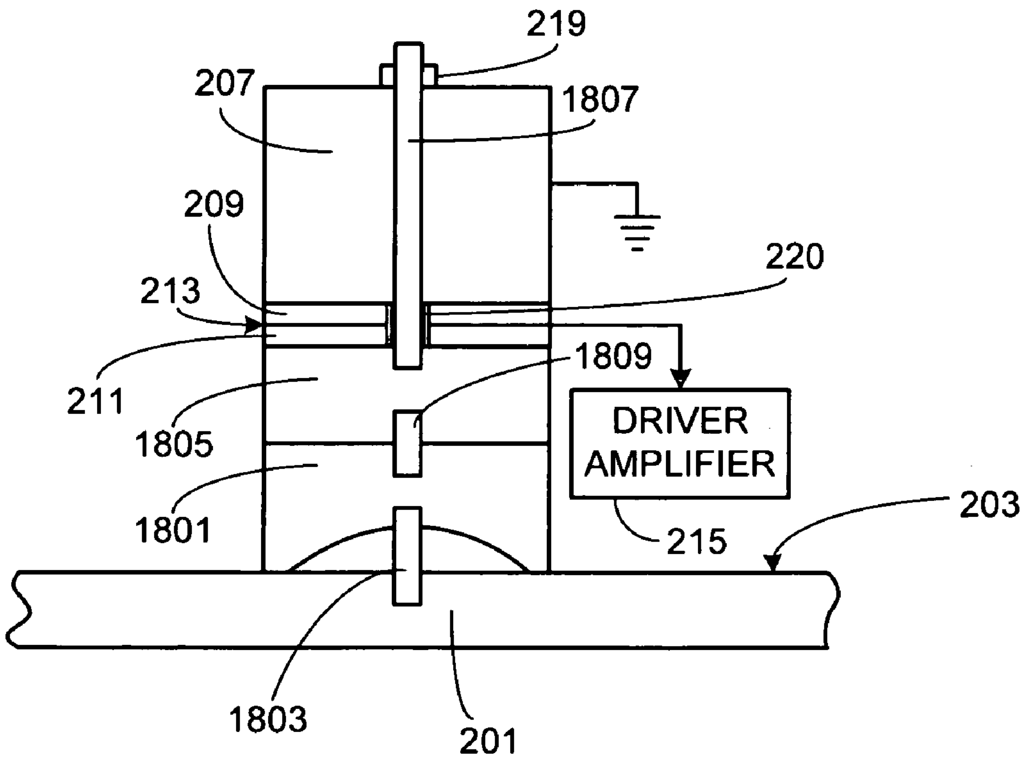
FIG. 18 is a cross-sectional view of an assembly illustrating an alternate means of attaching any of the driver assemblies of FIGS. 2–15 to a cavitation chamber wall.
Figure 19:
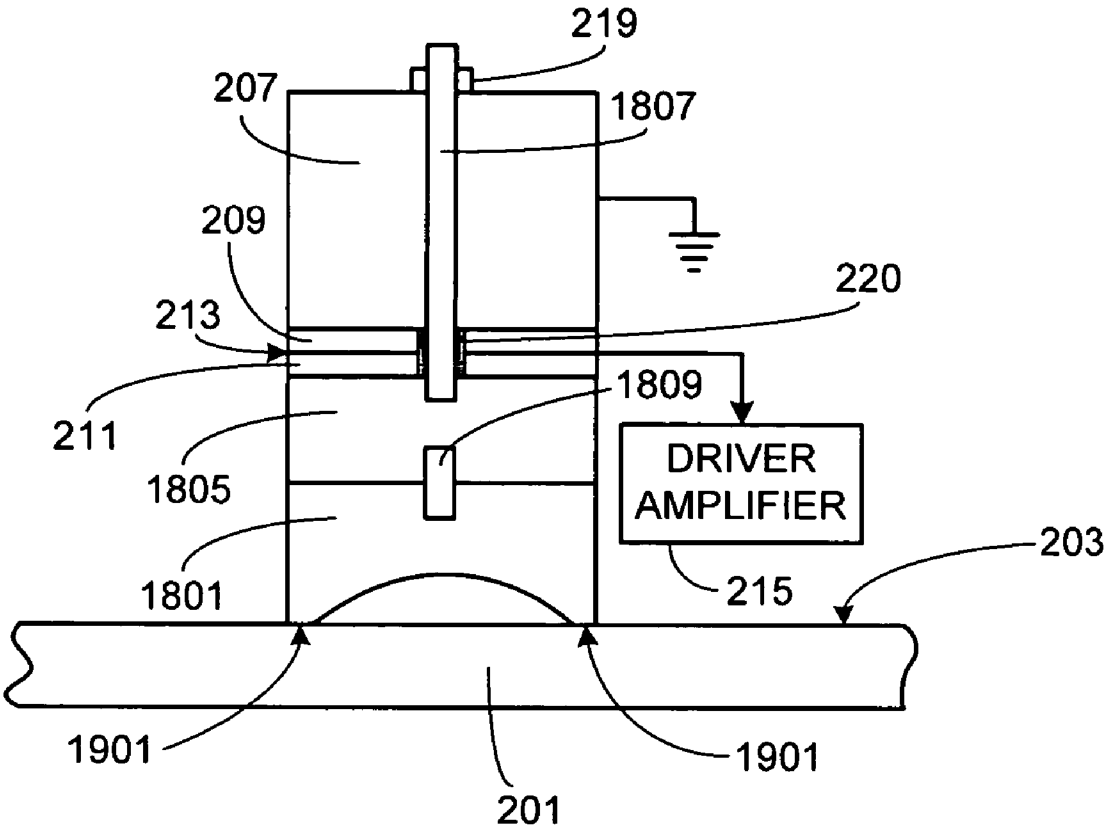
FIG. 19 is a cross-sectional view of an assembly illustrating an alternate means of attaching any of the driver assemblies of FIGS. 2–15 to a cavitation chamber wall.

If desired, and as a means of allowing the driver assembly to be assembled/disassembled separately from the chamber/head mass assembly, a two-piece head mass assembly, such as that illustrated in either FIG. 18 or FIG. 19, can be used. As shown in FIG. 18, a first head mass portion 1801 is coupled to chamber exterior surface 203 using a first threaded means 1803 (e.g., all-thread) while a second head mass portion 1805 is coupled to the driver assembly via a second threaded means 1807 (e.g., all-thread/nut arrangement or bolt). A third threaded means 1809 couples head mass portion 1801 to head mass portion 1805. In a slight modification shown in FIG. 19, first head mass portion 1801 is semi-permanently or permanently attached to the cavitation chamber at a joint 1901, joint 1901 comprised of an epoxy (or other adhesive) bond joint, a braze joint, a diffusion bond joint, or other means. The principal benefit of the configurations shown in FIGS. 18 and 19 is that the driver assembly is independent of the driver-chamber coupling means. As a result, a driver assembly can be attached to, or detached from, a cavitation chamber without disassembling the actual driver assembly. This is especially beneficial given the susceptibility of piezo-electric crystals to damage.

Although not required by the invention, preferably void filling material is included between adjacent pairs of surfaces of the driver assembly and/or the driver assembly and the exterior surface of the cavitation chamber, thereby improving the overall coupling efficiency and operation of the driver. Suitable void filling material should be sufficiently compressible to fill the voids or surface imperfections of the adjacent surfaces while not being so compressible as to overly dampen the acoustic energy supplied by the transducers. Preferably the void filling material is a high viscosity grease, although wax, very soft metals (e.g., solder), or other materials can be used.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A cavitation system, comprising:

a cavitation chamber, wherein at least one wall of said cavitation chamber comprises a flat external surface;

an acoustic driver assembly coupled to said cavitation chamber, comprising:

at least one piezo-electric transducer;

a tail mass adjacent to a first side of said at least one piezo-electric transducer;

a head mass with a first end surface and a second end surface, wherein said first end surface of said head mass is adjacent to a second side of said at least one piezo-electric transducer and said second end surface of said head mass is adjacent to a portion of said flat external surface, wherein a first portion of said second end surface of said head mass is surrounded by a second portion of said second end surface of said head mass, wherein said second portion of said second end surface extends beyond said first portion of said second end surface, and wherein said second portion of said second end surface defines a ring of contact between an outer perimeter of said second end surface of said head mass and said flat external surface;

means for assembling said acoustic driver assembly; and means for attaching said acoustic driver assembly to said flat external surface.

2. The cavitation system of claim 1, wherein said assembling means and said attaching means comprise a centrally located threaded means coupling said tail mass, said at least one piezo-electric transducer and said head mass to said flat external surface, wherein said centrally located threaded means is threaded into a corresponding threaded hole in said flat external surface, wherein said threaded hole extends at least part way through said cavitation chamber wall.

3. The cavitation system of claim 2, said centrally located threaded means further comprising a corresponding threaded nut, wherein said threaded nut compresses said tail mass, said at least one piezo-electric transducer and said head mass against said flat external surface.

4. The cavitation system of claim 2, wherein said threaded hole extends completely through said cavitation chamber wall, and wherein said acoustic driver assembly further comprises a sealant interposed between said centrally located threaded means and said threaded hole.

5. The cavitation system of claim 2, further comprising an insulating sleeve surrounding a portion of said centrally located threaded means, wherein said insulating sleeve is interposed between said centrally located threaded means and said at least one piezo-electric transducer.

6. The cavitation system of claim 1, said assembling means further comprising a first centrally located threaded means coupling said tail mass, said at least one piezo-electric transducer and said head mass together, wherein said first centrally located threaded means is threaded into a corresponding threaded hole in said head mass.

7. The cavitation system of claim 6, said first centrally located threaded means further comprising a corresponding threaded nut, wherein said threaded nut compresses said tail mass and said at least one piezo-electric transducer against said head mass.

8. The cavitation system of claim 6, said attaching means further comprising a second centrally located threaded means, wherein a first end portion of said second centrally located threaded means is threaded into said head mass and a second end portion of said second centrally located threaded means is threaded into a corresponding threaded hole in said flat external surface.

9. The cavitation system of claim 6, said attaching means further comprising an epoxy bond joint.

10. The cavitation system of claim 6, said attaching means further comprising a braze joint.

11. The cavitation system of claim 6, said attaching means further comprising a diffusion bond joint.

12. The cavitation system of claim 6, further comprising an insulating sleeve surrounding a portion of said first centrally located threaded means, wherein said insulating sleeve is interposed between said first centrally located threaded means and said at least one piezo-electric transducer.

13. The cavitation system of claim 1, said head mass further comprising a first head mass portion and a second head mass portion, wherein said first head mass portion includes said first end surface and said second head mass portion includes said second end surface, and wherein a first threaded means couples said first head mass portion to said second head mass portion.

14. The cavitation system of claim 13, said assembling means further comprising a second threaded means coupling said tail mass, said at least one piezo-electric transducer and said first head mass portion together, wherein said second threaded means is threaded into a corresponding threaded hole in said first head mass portion.

15. The cavitation system of claim 14, said second threaded means further comprising a corresponding threaded nut, wherein said threaded nut compresses said tail mass and said at least one piezo-electric transducer against said first head mass portion.

16. The cavitation system of claim 13, said attaching means further comprising a third threaded means, wherein a first end portion of said third threaded means is threaded into said second head mass portion and a second end portion of said third threaded means is threaded into a corresponding threaded hole in said flat external surface.

17. The cavitation system of claim 13, said attaching means further comprising an epoxy bond joint.

18. The cavitation system of claim 13, said attaching means further comprising a braze joint.

19. The cavitation system of claim 13, said attaching means further comprising a diffusion bond joint.

20. The cavitation system of claim 14, further comprising an insulating sleeve surrounding a portion of said second threaded means, wherein said insulating sleeve is interposed between said second threaded means and said at least one piezo-electric transducer.

21. The cavitation system of claim 1, wherein said at least one piezo-electric transducer is comprised of a first and a second piezo-electric transducer, wherein adjacent surfaces of said first and second piezo-electric transducers have the same polarity.

22. The cavitation system of claim 21, further comprising an electrode interposed between said adjacent surfaces of said first and second piezo-electric transducers.

23. The cavitation system of claim 1, wherein said tail mass and said head mass are of approximately equal mass.

24. The cavitation system of claim 1, wherein said tail mass and said head mass are comprised of stainless steel.

25. The cavitation system of claim 1, further comprising a void filling material interposed between at least two adjacent contact surfaces of said acoustic driver assembly.

26. The cavitation system of claim 1, further comprising a void filling material interposed between said second surface of said head mass and said flat external surface.

* * * * *